(12) United States Patent
Cabahug et al.

(10) Patent No.: US 7,122,884 B2
(45) Date of Patent: Oct. 17, 2006

(54) ROBUST LEADED MOLDED PACKAGES AND METHODS FOR FORMING THE SAME

(75) Inventors: Elsie Agdon Cabahug, Mandaue (PH); Marvin Rosalejos Gestole, Lapulapu (PH); Margie Sebial Tumulak-Rios, Mandaue (PH); Lilith U. Montayre, Cebu (PH); Romel N. Manatad, Mandaue (PH)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/413,668

(22) Filed: Apr. 14, 2003

(65) Prior Publication Data

US 2003/0193080 A1 Oct. 16, 2003

Related U.S. Application Data

(60) Provisional application No. 60/376,812, filed on Apr. 29, 2002, provisional application No. 60/373,370, filed on Apr. 16, 2002.

(51) Int. Cl.
*H01L 23/495* (2006.01)

(52) U.S. Cl. ...................... 257/676; 257/672

(58) Field of Classification Search ................. 257/672, 257/676, 728, 666
See application file for complete search history.

(56) References Cited

U.S. PATENT DOCUMENTS

| | | | |
|---|---|---|---|
| 5,540,378 A * | 7/1996 | Mahulikar et al. ..... | 228/180.21 |
| 5,637,916 A | 6/1997 | Joshi | |
| 5,765,280 A | 6/1998 | Joshi | |
| 5,789,809 A | 8/1998 | Joshi | |
| 6,023,080 A * | 2/2000 | Kojima ...................... | 257/275 |
| 6,133,634 A | 10/2000 | Joshi | |
| 6,274,905 B1 | 8/2001 | Mo | |
| 6,281,581 B1 * | 8/2001 | Desai et al. ................. | 257/737 |
| 6,294,403 B1 | 9/2001 | Joshi | |
| 6,307,755 B1 | 10/2001 | Williams et al. | |
| 6,320,251 B1 | 11/2001 | Glenn | |
| 6,337,510 B1 * | 1/2002 | Chun-Jen et al. ........... | 257/666 |
| 6,391,687 B1 | 5/2002 | Cabahug et al. | |
| 6,424,031 B1 * | 7/2002 | Glenn ......................... | 257/686 |
| 6,469,384 B1 | 10/2002 | Joshi | |
| 6,489,678 B1 | 12/2002 | Joshi | |
| 6,566,749 B1 | 5/2003 | Joshi et al. | |
| 6,627,991 B1 | 9/2003 | Joshi | |
| 6,645,791 B1 | 11/2003 | Noquil et al. | |

(Continued)

FOREIGN PATENT DOCUMENTS

DE  100 62 542.8  6/2001

OTHER PUBLICATIONS

U.S. Appl. No. 10/411,688, Joshi et al.

(Continued)

*Primary Examiner*—Phat X. Cao
(74) *Attorney, Agent, or Firm*—Townsend and Townsend and Crew LLP

(57) ABSTRACT

A method for making a flip chip in a leaded molded package is disclosed. In some embodiments, the method includes using a leadframe structure including a die attach region and leads. The die attach region includes depressions proximate the inner portions of the leads, and an aperture in the die attach region. A semiconductor die is mounted to the die attach region. A molding material passes through the aperture and covers the first surface of the semiconductor die and the die attach region.

12 Claims, 9 Drawing Sheets

U.S. PATENT DOCUMENTS

| | | | |
|---|---|---|---|
| 6,646,329 B1 | 11/2003 | Estacio et al. | |
| 6,720,642 B1* | 4/2004 | Joshi et al. | 257/673 |
| 6,777,786 B1 | 8/2004 | Estacio | |
| 6,861,286 B1 | 3/2005 | Estacio et al. | |
| 6,870,254 B1 | 3/2005 | Estacio et al. | |
| 6,943,434 B1 | 9/2005 | Tangpuz et al. | |
| 6,949,410 B1 | 9/2005 | Joshi et al. | |
| 2001/0048149 A1* | 12/2001 | Cheng et al. | 257/672 |
| 2002/0065661 A1 | 5/2002 | Everhart et al. | |
| 2002/0066950 A1 | 6/2002 | Joshi | |
| 2002/0066959 A1 | 6/2002 | Joshi | |
| 2002/0100962 A1 | 8/2002 | Joshi | |
| 2002/0125550 A1* | 9/2002 | Estacio | 257/666 |
| 2002/0155642 A1 | 10/2002 | Noquil et al. | |
| 2002/0171126 A1 | 11/2002 | Estacio et al. | |
| 2002/0192935 A1 | 12/2002 | Joshi et al. | |
| 2003/0011005 A1 | 1/2003 | Joshi | |
| 2003/0042403 A1 | 3/2003 | Joshi | |
| 2003/0052408 A1 | 3/2003 | Quinones et al. | |
| 2003/0067057 A1* | 4/2003 | Wu | 257/666 |
| 2003/0075786 A1* | 4/2003 | Joshi et al. | 257/676 |
| 2003/0107126 A1 | 6/2003 | Joshi | |
| 2003/0122247 A1 | 7/2003 | Joshi | |
| 2003/0139020 A1 | 7/2003 | Estacio | |
| 2003/0173684 A1 | 9/2003 | Joshi et al. | |
| 2003/0189248 A1 | 10/2003 | Estacio et al. | |
| 2003/0193080 A1 | 10/2003 | Cabahug et al. | |
| 2003/0205798 A1 | 11/2003 | Noquil et al. | |
| 2004/0207052 A1 | 10/2004 | Joshi et al. | |
| 2005/0130350 A1 | 6/2005 | Estacio et al. | |
| 2005/0167848 A1 | 8/2005 | Joshi et al. | |

OTHER PUBLICATIONS

U.S. Appl. No. 09/464,885, Joshi et al.

* cited by examiner

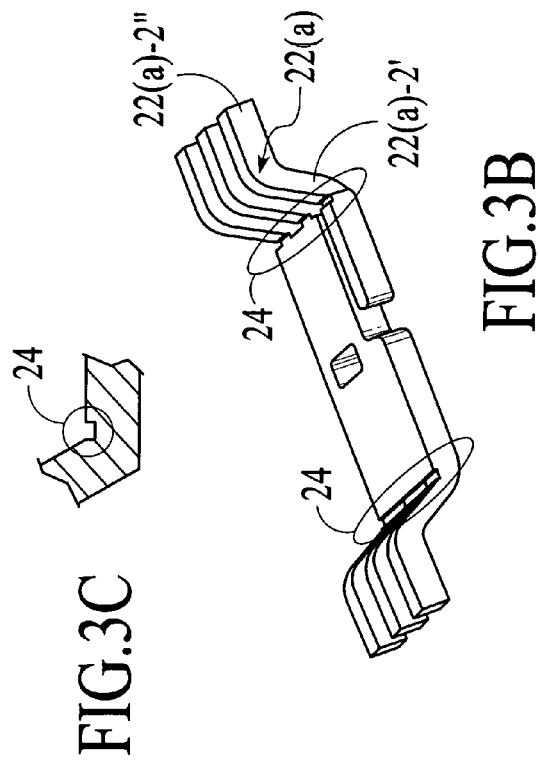
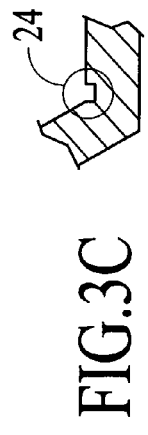
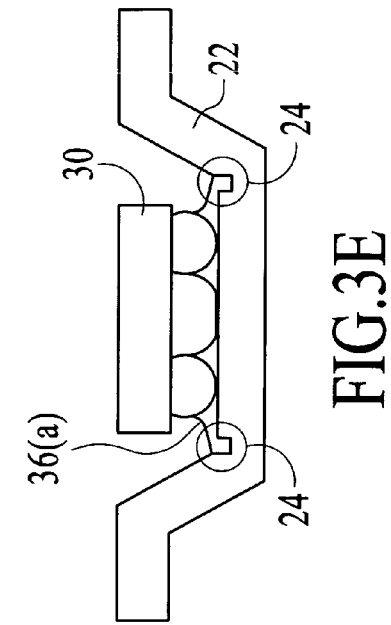
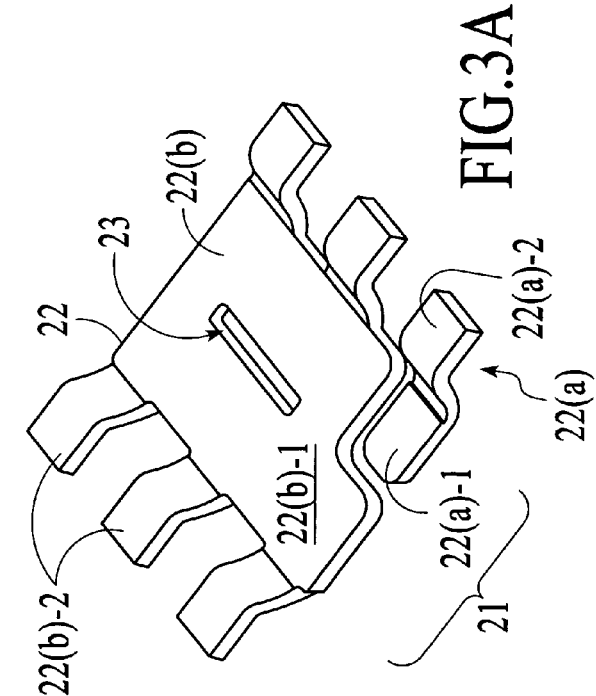
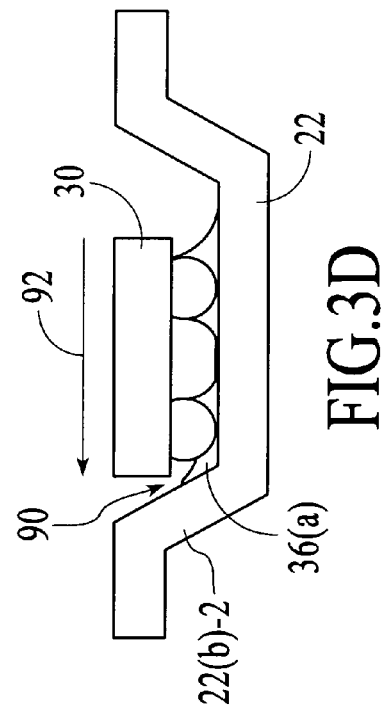

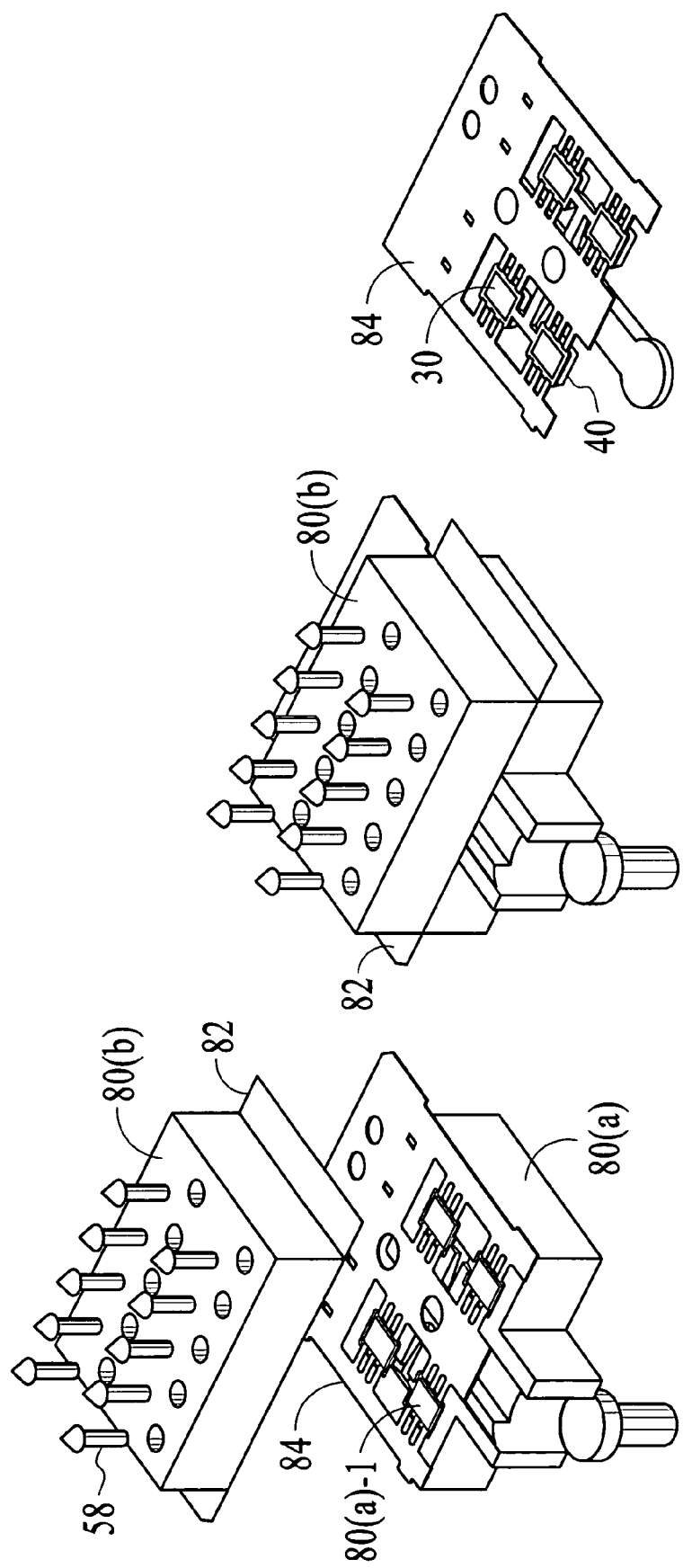

ROBUST LEADED MOLDED PACKAGES AND METHODS FOR FORMING THE SAME

CROSS-REFERENCE TO RELATED APPLICATIONS

This application is a non-provisional application of and claims the benefit of U.S. Provisional Application No. 60/373,370, filed on Apr. 16, 2002, and U.S. Provisional Application No. 60/376,812, filed on Apr. 29, 2002. Both of these U.S. Provisional Applications are herein incorporated by reference in their entirety for all purposes.

BACKGROUND OF THE INVENTION

There are a number of different types of semiconductor packages. One type of semiconductor package is called a flip chip in a leaded molded package (FLMP). This package is described in detail in U.S. patent application Ser. No. 09/464,885, entitled "Flip Chip in Molded Lead Package & Method of Manufacture Thereof", by Rajeev Joshi, filed on Dec. 16, 1999. The flip chip in a leaded molded package includes a leadframe structure that has a die attach pad and leads that extend away from the die attach pad. The die attach pad is coupled to the front side of a semiconductor die with solder. A molding material covers the die attach pad and the front side of the semiconductor die, while the back side of the semiconductor die is exposed through the molding material. The leads extend laterally away from the molding material and are substantially co-planar with the back side of the semiconductor die and a surface of the molding material. The front side of the semiconductor die may correspond to the gate region and the source region of a MOSFET (metal oxide semiconductor field effect transistor) in the semiconductor die. The back side of the semiconductor die may correspond to the drain region of the MOSFET. When the semiconductor package is mounted to a circuit substrate, the back side of the die and the leads are connected to conductive lands on the circuit substrate with solder. The circuit substrate may be a printed circuit board.

The above-described semiconductor package has a number of advantages. First, because there is a substantially direct electrical connection between the back side of the semiconductor die and the circuit substrate, and because there are short, low-resistance conductive paths between the source and gate regions in the semiconductor die, and the circuit substrate, the die package resistance is nearly eliminated, allowing for the industry's lowest $R_{DS(ON)}$ for the same package footprint. $R_{DS(ON)}$ is the on-resistance that is associated with turning a MOSFET in the die package on from an off-state. Second, the above-described semiconductor package is thin. For example, compared to a conventional wire bonded SOIC-8 package, which is about 1.6 mm tall, a flip chip in a leaded molded package can have a height of less than about 1.0 mm. The flip chip in a leaded molded package can have the same or better electrical and thermal performance, while being smaller than a standard SOIC-8 package. Thin semiconductor packages are especially desirable for small portable electronic devices such as wireless phones and laptop computers.

While the above-described semiconductor package has a number of advantages, a number of improvements could be made. When mass producing semiconductor packages of the type described above, a number of problems can occur. The problems include, for example, silicon cracks that form because of an uneven die standoff from the die attach region of the leadframe structure, moisture seepage into the semiconductor package, delamination between the leadframe structure and the molding material, and molding material bleed on an exposed die surface and leads (which can hinder the package from functioning efficiently or potentially fail during device applications). Other problems include poor solder adhesion between the circuit board bonding pads and the semiconductor die and uneven cutting during the singulation process.

These and other problems are addressed by embodiments of the invention.

SUMMARY OF THE INVENTION

Embodiments of the invention are directed to semiconductor packages and methods for making semiconductor packages. Some embodiments of the invention are directed to flip chip in leaded molded packages (FLMP). Although flip chip in leaded molded packages are described in detail below, some embodiments of the invention can be extended to other types of semiconductor packages.

One embodiment of the invention is directed to a semiconductor package comprising: (a) a semiconductor die including a first side and a second side, wherein the semiconductor die further includes a bond pad at the first side, the bond pad comprising an uneven surface; (b) a leadframe structure comprising (i) a die attach region, and (ii) a plurality of leads extending away from the die attach region; (c) a plurality of solder structures between the semiconductor die and the leadframe structure and coupling the die attach region to the semiconductor die; (d) a depression formed in the leadframe structure, the depression being between the one of the solder structures in the plurality of solder structures, and one of the leads in the plurality of leads; and (e) a molding material covering the die attach region of the leadframe structure, the plurality of solder structures, and the first side of the semiconductor die.

Another embodiment of the invention is directed to a semiconductor package comprising: (a) a semiconductor die including a first side and a second side; (b) a leadframe structure comprising (i) a die attach region comprising an aperture that passes through the die attach region, and (ii) a plurality of leads extending away from the die attach region; (c) a plurality of solder structures between the semiconductor die and the leadframe structure and coupling the die attach region to the semiconductor die; (d) a depression in the leadframe structure, the depression being between the one of the solder structures in the plurality of leadframe structures, and one of the leads in the plurality of leads; and (e) a molding material covering the die attach region of the leadframe structure, the plurality of solder structures, and the first side of the semiconductor die, and wherein the molding material is also within the aperture of the die attach region.

Another embodiment of the invention is directed to a semiconductor package comprising: (a) a semiconductor die including a first side and a second side, wherein the semiconductor die further includes a bond pad at the first side, the bond pad comprising an uneven surface; (b) a leadframe structure comprising (i) a die attach region and an aperture in the die attach region, and (ii) a plurality of leads extending away from the die attach region; (c) a plurality of solder structures between the semiconductor die and the leadframe structure and coupling the die attach region to the semiconductor die; and (d) a molding material covering the die attach region of the leadframe structure, the solder structure, and the first side of the semiconductor die, and wherein the molding material is also within the aperture.

Another embodiment of the invention is directed to a method for forming a semiconductor package, the method comprising: (a) providing a plurality of leadframe structures in a leadframe carrier comprising a saw guide slot, wherein the leadframe carrier comprises a plurality of leadframe structures, each leadframe structure comprising (i) a die attach region, and (ii) a plurality of leads extending away from the die attach region; (b) attaching semiconductor dies to the die attach regions, wherein a plurality of solder structures is between each semiconductor die and each die attach region; (c) molding a molding material around at least a portion of each semiconductor die and at least a portion of each die attach region; and (d) cutting the leadframe carrier with a saw using the saw guide slot.

Another embodiment is directed to a method for forming a semiconductor package, the method comprising: (a) providing a leadframe structure comprising (i) a die attach region comprising an aperture, (ii) a plurality of leads extending away from the die attach region, and (iii) a plurality of depressions, each depression being proximate to an inner portion of a lead; (b) attaching a semiconductor die to the die attach region, wherein the semiconductor die comprises a first side, a second side, and a bond pad at the first side, and wherein a plurality of solder structures is between the semiconductor die and the die attach region; (c) reflowing the plurality of solder structures; and (d) molding a molding material around at least a portion of the semiconductor die and at least a portion of each die attach region, wherein the molding material passes through the aperture in the die attach region.

Another embodiment of the invention is directed to a method for forming a semiconductor package, the method comprising: (a) providing a leadframe structure comprising (i) a die attach region comprising an aperture, (ii) a plurality of leads extending away from the die attach region, and (iii) a plurality of depressions, each depression being proximate to an inner portion of a lead; (b) attaching a semiconductor die to the die attach region, wherein the semiconductor die comprises a first side, a second side, and a bond pad at the first side, and wherein a plurality of solder structures is between the semiconductor die and the die attach region; (c) reflowing the plurality of solder structures; and (d) molding a molding material around at least a portion of the semi-conductor die and at least a portion of each die attach region, wherein the molding material passes through the aperture in the die attach region.

Another embodiment of the invention is directed to a method for forming a semiconductor package, the method comprising: (a) providing a leadframe structure comprising (i) a die attach region, (ii) a plurality of leads extending away from the die attach region, and (iii) a plurality of depressions, each depression being proximate to an inner portion of a lead in the plurality of leads and the die attach region; (b) attaching a semiconductor die to the die attach region, wherein the semiconductor die comprises a first side, a second side, and a bond pad having an uneven surface at the first side, and wherein a plurality of solder structures is between the semiconductor die and the die attach region; (c) reflowing the plurality of solder structures; and (d) molding a molding material around each at least a portion of the semiconductor die and at least a portion of each die attach region.

These and other embodiments of the invention are described in further detail below with reference to the Figures and the Detailed Description.

BRIEF DESCRIPTION OF THE DRAWINGS

FIG. 3(a) shows a perspective view of a leadframe structure according to an embodiment of the invention.

FIG. 3(b) shows a perspective view of a leadframe structure according to an embodiment of the invention with depressions.

FIG. 3(c) shows a side cross-sectional view of a leadframe structure showing a depression between a portion of a lead and a portion of a die attach pad.

FIG. 3(d) shows a side view of how the position of a mounted die can shift during solder reflow, if depressions are not present in the leadframe structure.

FIG. 3(e) shows a side view of how the position of a mounted die does not shift during solder reflow when depressions are present in the leadframe structure.

FIG. 6(a) shows a molding apparatus with two molding dies in an open position, and with a leadframe carrier on the bottom molding die.

FIG. 6(b) shows the molding apparatus shown in FIG. 6(a) in a closed position.

FIG. 6(c) shows a leadframe carrier with a number of molded packages after a molding process.

DETAILED DESCRIPTION

Embodiments of the invention are directed to semiconductor packages and methods for making semiconductor packages. Embodiments of the invention can be applied to semiconductor packages with various pinouts such as 6, 8, etc. leads, while employing single sided molding technology. In some embodiments, the packages may be "single-sided" rather than semiconductor packages that are "double-sided". Single-sided semiconductor packages have molding material at one side of the die, while double-sided packages have molding material at both sides of the die.

Embodiments of the invention have a low package profile. Embodiments of the invention also provide a small package footprint, while increasing the die to package ratio for a given footprint, which is not possible for a wire-bonded type package. Also, in embodiments of the invention, the back side of the semiconductor die is exposed through the molding material in the package, thus improving heat dissipation to the underlying circuit substrate (as compared to a package where a molding material covers the back side).

Figure 1:
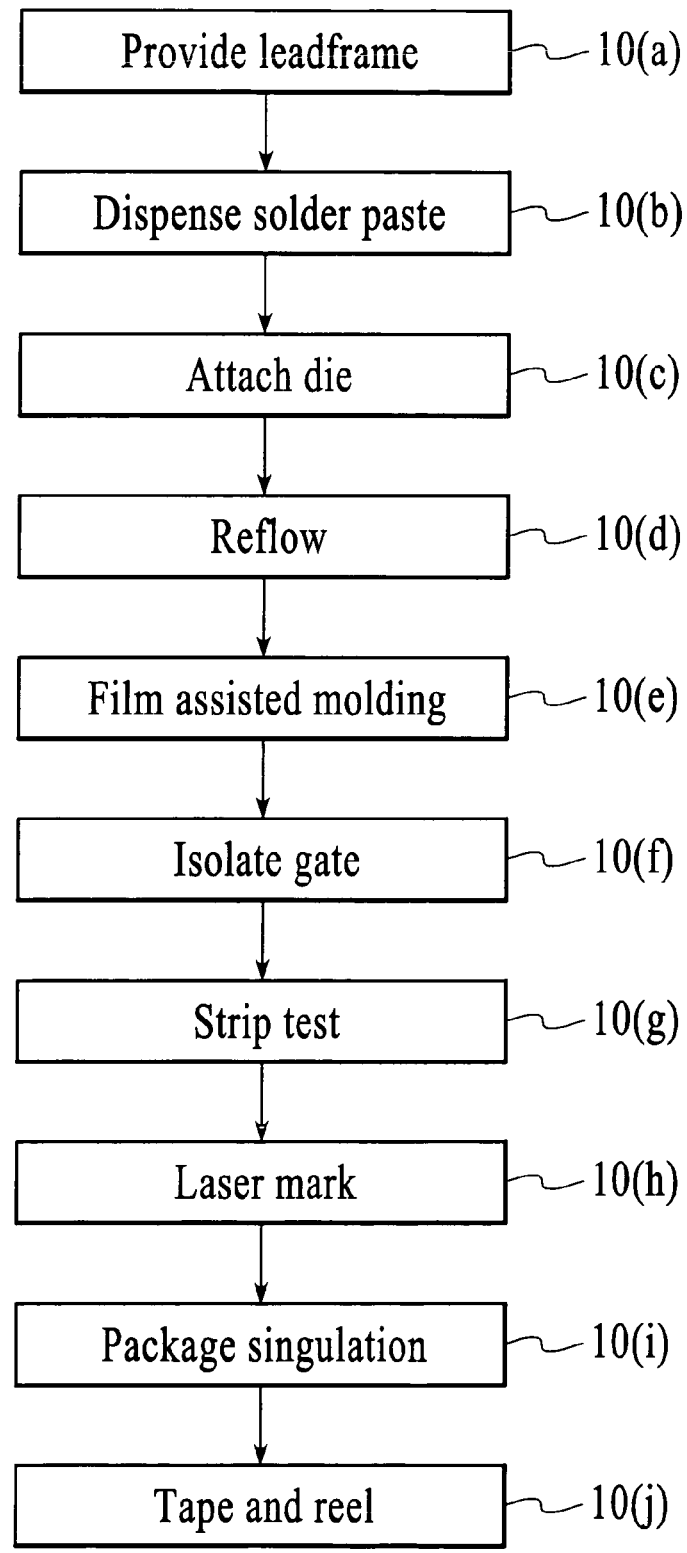
FIG. 1 shows a flowchart illustrating a method according to an embodiment of the invention.

FIG. 1 shows a flowchart illustrating an exemplary process flow according to an embodiment of the invention. Each step in the flowchart is described in further detail below.

First, a leadframe structure is provided (step 10(a)). The leadframe structure may be one of many leadframe structures in a leadframe carrier, which can be in the form of a strip. During processing, the leadframe structures may be present in a leadframe carrier if multiple leadframe structures are processed together. Each leadframe structure can include a die attach region, and two or more leads. The leads extend away from the die attach region. A single lead frame structure may include a gate lead structure with a gate attach region and a gate lead and a source lead structure with a plurality of source leads and a source attach region. The source lead structure and the gate lead structure are electrically isolated from each other in the semiconductor package that is eventually formed.

In some embodiments, the leadframe structure may include a leadframe plating. A leadframe plating comprises layers that are formed on a base metal of a leadframe structure prior to solder dispensing. A typical leadframe plating comprises an adhesion sublayer, and a wettable/protective sublayer. For example, an exemplary leadframe plating may comprise at least a nickel sublayer and a palladium sublayer. The plating may also comprise a gold sublayer as an outer, solder-wettable sublayer. The base metal of the leadframe structure may comprise any suitable metal including copper or a copper alloy.

After a leadframe structure is obtained, solder is dispensed on the die attach region of the leadframe structure (step 10(b)). The solder may be dispensed in an array on the die attach region of the leadframe structure. A dispenser with multiple nozzles may be used to dispense solder. If the semiconductor die comprises a vertical MOSFET, the dispensed solder may eventually be coupled to the source and gate regions of the MOSFET.

After dispensing solder on the die attach region of the leadframe structure, a semiconductor die can be attached to the die attach region of the leadframe structure (step 10(c)). If the semiconductor die comprises a vertical MOSFET, the semiconductor die may have at least one gate region and a gate pad, and at least one source region and a source pad at a first side. A drain region may be at the second side of the semiconductor die. Conductive structures such as high lead solder bumps may be attached to the at least one gate pad and at least one source pad. The conductive structures can be attached to the leadframe structure through the previously dispensed solder, by flipping the bumped semiconductor die over and aligning the high lead solder bumps with the dispensed array of solder on the die attach region of the leadframe structure. Each high lead bump and solder combination may be characterized as a solder structure.

After attaching the semiconductor die to the die attach region of the leadframe structure, the solder structures between the semiconductor die and the die attach region of the leadframe structure are subjected to a reflow process (step 10(d)). After reflowing, the reflowed solder structures provide a mechanical and an electrical connection between the leadframe structure and the semiconductor die. During reflow, the solder melts and solidifies, while the high lead solder bumps undergo minimal or no melting, so that they do not deform in a substantial manner. This keeps the semiconductor die and the die attach region of the leadframe structure spaced at a uniform distance, thus keeping the back side of the semiconductor die aligned with the ends of the leads of the leadframe structure. Thus, the solder that is chosen (whether or not it is a eutectic solder) has a melting temperature above the board mounting requirement, and below the melting point of the high-lead solder bumps on the semiconductor die.

After the solder reflow step, a molding material is molded around at least the die attach region of each leadframe structure and the first surface of each semiconductor die (step 10(e)). As will be described in further detail below, the molding material may comprise an epoxy molding material. The molding process is preferably a film assisted molding process. Film assisted molding processes are described in further detail below.

After molding the molding material, the gate lead structure of each leadframe structure can be electrically isolated from its corresponding source lead structure by severing the electrical connection between them (step 10(f)). Then, the non-singulated semiconductor packages may be electrically tested (step 10(g)). Parametric testing is performed while the semiconductor packages are in the form of a strip. After electrical testing, the molded molding material in the semiconductor packages may be laser marked (step 10(h)).

After laser marking, the semiconductor packages in the array of semiconductor package are singulated (step 10(i)). In a preferred singulation process, a saw is used to separate the individual packages from other packages. Saw slots may be provided in a leadframe carrier to help guide the saw during singulation process and avoid mis-aligned cutting. After singulation, a conventional tape and reel process may be performed (step 10(j)).

Each of the foregoing steps, structures, and packages is described in further detail below with reference to FIGS. 2–9(b).

Figure 2:
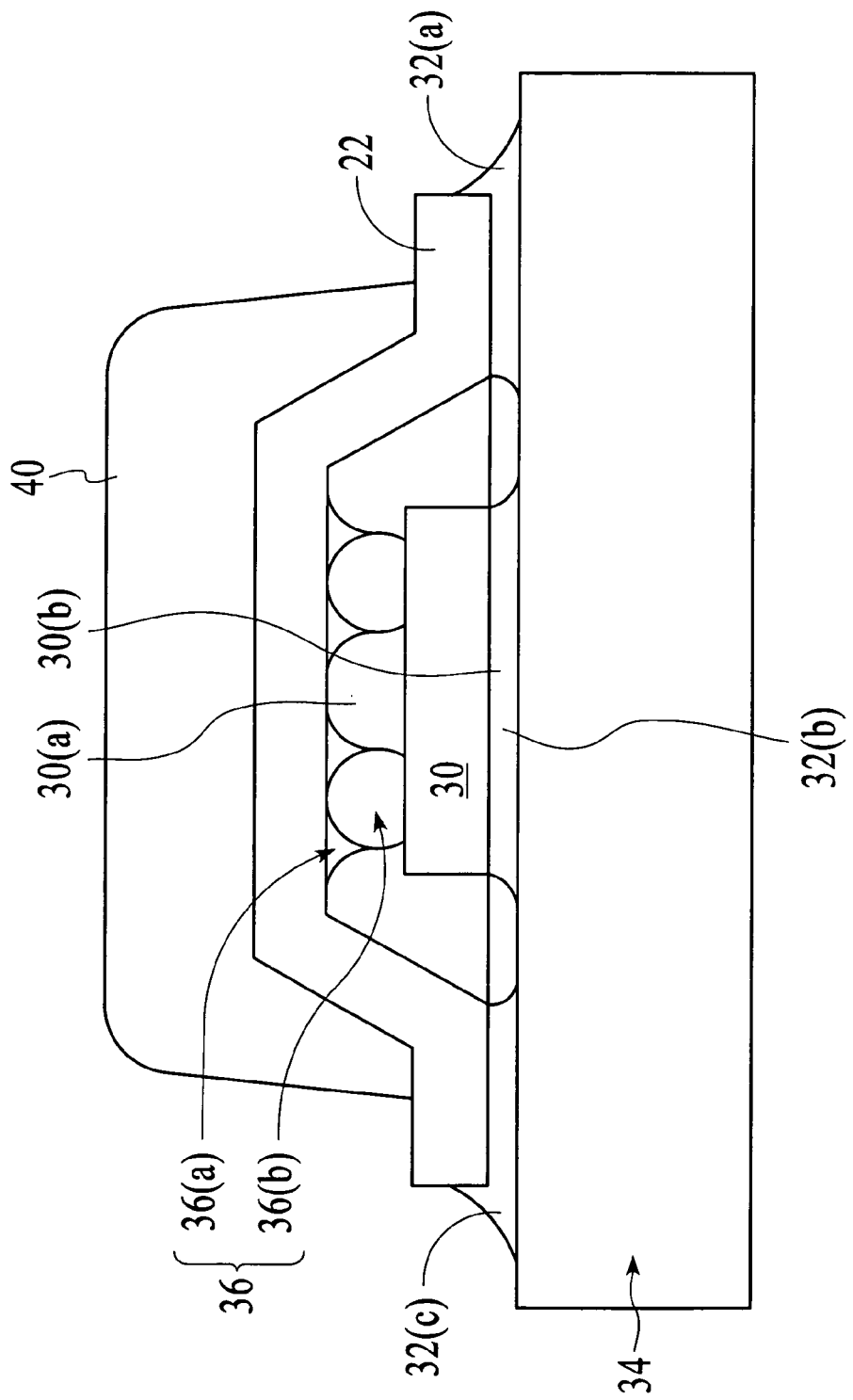
FIG. 2 shows a side cross-sectional view of a flip chip in leaded molded package mounted on a circuit substrate.

FIG. 2 shows a cross-sectional view of a semiconductor package 100 mounted to a circuit substrate 34. The circuit substrate 34 may be a printed circuit board with one or more dielectric layers, and one or more conductive layers (not shown in FIG. 2). The circuit substrate 34 and the semiconductor package 100 are coupled together via a number of reflowed solder paste deposits 32(a), 32(b), 32(c). Each reflowed solder paste deposit 32(a), 32(b), 32(c) may comprise a solder with a low melting point.

The semiconductor package 100 comprises a leadframe structure 22 and a semiconductor die 30 attached to the leadframe structure 22. An array of solder structures 36 is between the semiconductor die 30 and the leadframe structure 22. Each solder structure comprises a solder bump 36(b) and reflowed solder paste 36(a). The array of solder structures 36 results in smaller inductances than, for example, wire bonds.

The semiconductor die 30 has a first side 30(a) and a second side 30(b). If the semiconductor die comprises a vertical MOSFET, then the source region and the gate region (not shown) of the vertical MOSFET can be at the first side 30(a) of the semiconductor die 30 and the drain region can be at the second side 30(b) of the semiconductor die 30. The second side 30(b) may be coated with gold or other solder-wettable material. The drain region of the MOSFET at the second side 30(b) would be coupled to the circuit substrate 34 via solder paste deposit 32(b). The source region and the gate region of the MOSFET would be coupled to the circuit substrate 34 via solder paste deposits 32(a), 32(c), which couple the ends of the leadframe structure 22 to the circuit substrate 34.

The semiconductor die in the semiconductor package may comprise a transistor such as a vertical power transistor. Exemplary vertical power transistors are described, for example, in U.S. Pat. Nos. 6,274,905, and 6,351,018, both of which are assigned to the same assignee as the present application, and both which are herein incorporated by reference in their entirety for all purposes. Vertical power transistors include VDMOS transistors and vertical bipolar power transistors. A VDMOS transistor is a MOSFET (metal oxide semiconductor field effect transistor) that has two or more semiconductor regions formed by diffusion. It has a source region, a drain region, and a gate. The device is vertical in that the source region and the drain region are at opposite surfaces of the semiconductor die. The gate may be a trenched gate structure or a planar gate structure, and is formed at the same surface as the source region. During operation, the current flow from the source region to the drain region in a VDMOS device is substantially perpendicular to the die surfaces. In other embodiments, the transistors in the semiconductor dies can be bipolar transistors. In such embodiments, one side of the semiconductor die can have an emitter region and a base region. The other side of the die can have a collector region.

Vertical power transistor devices have advantages over LDMOS (lateral diffused metal oxide semiconductor) devices, which have source regions and drain regions at the same side of a semiconductor die. For example, the cells in a VDMOS are smaller and denser than the cells in an LDMOS device, since the source region and the drain region in a VDMOS device are at opposite sides of the semiconductor die. Consequently, a VDMOS device can have a lower "on" resistance than an LDMOS device. Also, VDMOS devices generally exhibit higher gain and higher saturation current than LDMOS devices.

As will be explained in further detail below, the solder deposit 36(a) may comprise a eutectic solder. The eutectic temperature of an alloy is lower than the melting point of any of its individual constituents. The eutectic temperature is the particular temperature at which the eutectic occurs. For example, eutectic solder paste has a composition of 63% tin (Sn) and 37% lead (Pb) (weight percentages), and has a eutectic temperature of 183° C.

Each solder bump structure 36 also comprises a solder bump 36(b) or other conductive bump material that has a melting temperature greater than the melting temperature of the solder paste 36(a). In this example, the solder bump 36(b) may comprise high lead solder. As used herein, "high lead solder" may be a solder composition where the weight percentage of lead in the solder is greater than about 70% (e.g., 95Pb/5Sn) by weight. In other embodiments, conductive columns (e.g., conductive copper columns) such as those described in U.S. patent application Ser. No. 09/881,787, filed on Jun. 15, 2001, entitled "Semiconductor Die Including Conductive Columns" by Rajeev Joshi et al., could be used. This U.S. Patent Application also discusses the use of high lead solder columns. This U.S. Patent Application is herein incorporated by reference for all purposes. In some embodiments, the melting temperatures of the solder can be chosen as follows: mounting board solder paste 32(a)–32(c)<solder deposit 36(a)<solder bumps 36(b).

The semiconductor package 100 comprises a molding material 40 that covers the inner portion (including the die attach region) of the leadframe structure 22, the plurality of solder structures 36, and at least the first side 30(a) of the semiconductor die 30. The molding material 40 also fills the spaces between the solder structures 36. As shown in FIG. 2, the bottom surface of the molding material 40 is substantially co-planar with the ends of the leads of the leadframe structure 22, and is also substantially co-planar with the second surface 30(b) of the semiconductor die 30. As shown, the ends of the leads of the leadframe structure 22 extend laterally away from the molding material 40. As shown in FIG. 2, the illustrated semiconductor package 100 has a low profile and is thin.

In preferred embodiments, the molding material 40 comprises an epoxy molding material. The epoxy molding material preferably has the following properties: (a) low thermal expansion (a low CTE), (b) fine filler size (for better flow distribution of the molding material in between small spaces, thus reducing the likelihood of forming voids in the formed semiconductor package), (c) a glass transition temperature of about 146° C., (d) a 10 second Ram Follower gel time at 175° C., and e) high adhesion strength to pre-plated leadframe structures. A preferred epoxy molding material can be Plaskon AMC-2RD molding compound, which is commercially available from Cookson Semiconductor Packaging Materials, of Singapore. This epoxy molding material has a low coefficient of thermal expansion, does not require a post mold cure, and is useful for high productivity processing. It also has good adhesion to pre-plated leadframes, thereby minimizing the likelihood of delamination between the molding material and the leadframe structure. The epoxy molding compound flows well and minimizes the formation of any gaps in the molding material. Other data and characteristics pertinent to this molding material are provided in U.S. Provisional Application No. 60/373,370, filed on Apr. 16, 2002, and U.S. Provisional Application No. 60/376,812, filed on Apr. 29, 2002.

FIG. 3(a) shows a leadframe structure 22 according to an embodiment of the invention. The leadframe structure 22 comprises a gate lead structure 22(a) including a gate attach region 22(a)-1 and a gate lead 22(a)-2, and a source lead structure 22(b) including a source attach region 22(b)-1 and five source leads 22(b)-2. The gate attach region 22(a)-1 and the source attach region 22(b)-1 can form the die attach region 21 of the leadframe structure 22, where the semiconductor die (not shown) is attached. The die attach region 21 is "downset" with respect to the ends of the gate lead 22(a)-2 and the source leads 22(b)-2.

The leadframe structure 22 includes a layer of metal plating (not shown) if desired. A layer of metal plating may comprise an adhesion sublayer layer such as nickel or chromium, a conductive sublayer such as copper or palladium, and/or an oxidation resistant layer such as gold. The base metal of the leadframe structure 22 may comprise a metal such as copper or a copper alloy.

The leadframe structure 22 may be formed in any suitable manner. For example, the base metal structure of the leadframe structure 22 may comprise copper, and may be formed by stamping or etching a copper sheet. A layer of metal plating may be formed on the base metal structure by processes such as electroless plating, sputtering, or electroplating. A pre-plated leadframe advantageously eliminates post plating processes, and provides wettable surfaces for solder paste on the conductive lands of a circuit substrate.

An aperture 23 is in the die attach region 21. The aperture 23 in this example is in the form of an elongated slot. Although the aperture 23 is in the form of an elongated slot, other aperture shapes (e.g., circular apertures, square apertures, etc.) are possible. The aperture 23 may be formed in the leadframe structure 22 by any suitable method including photolithography followed by etching, and stamping.

Instead of, or in addition to the aperture 23, the die attach region 21 of the leadframe structure 22 may comprise a number of dimples in it to improve adhesion to the molding material. Dimples may be formed in the die attach region 21 of the leadframe structure 22 using a process such as partial etching (using photolithography and a wet or dry etching process so that only part of the thickness of the die attach region 21 is etched). The molding material (not shown) may flow over and attach to the dimples, thus improving the bond between the molding material and the leadframe structure.

The aperture 23 in the die attach region 21 provides a passageway for a molding compound to flow through. The aperture 23 improves the molding material flow between the semiconductor die and the die attach region 21, thus eliminating package voids. When the molding material is disposed within the aperture 23, the molding compound "locks" onto the leadframe structure 22, thus decreasing the likelihood of delamination between the leadframe structure and the molding material (e.g., the locking feature helps hold the package together during stress-inducing processes such as a 3× reflow process). Also, when the molding material fills the spaces between and around the die, and the leadframe structure, the molding material secures the die and solder structures to the leadframe structure, thus reducing subsequent stresses caused by further processing or the end use of the semiconductor package. Additional descriptions of leadframe structures having a die attach regions with slots or apertures are described in U.S. patent application Ser. No. 10/411,688, filed Apr. 11, 2003, entitled "Lead frame structure with aperture or groove for flip chip in a leaded molded package", by Rajeev Joshi et al. This U.S. Patent Application is herein incorporated by reference in its entirety for all purposes.

Another feature of the leadframe structure 22 is shown in FIGS. 3(b) and 3(c). As shown in FIGS. 3(b) and 3(c), a number of depressions 24 are formed at edge regions of the die attach region 21, proximate to the inner portions of the leads 22(a)-2, 22(b)-2 and is distal to the outer portions of the leads. A depression 24 is formed at the edge of the gate attach region 22(a)-1 of the gate lead structure 22(a), and is proximate to the inner portion 22(a)-2' of the gate lead 22(a)-2. The outer portion 22(a)-2" of the gate lead 22(a) extends away from the die attach region 21 and is distal to the depression 24. There may be one depression 24 per lead in the leadframe structure. In some embodiments, gate attach region with a depression may be referred to as a "coined gate pad".

The depressions 24 in the leadframe structure 22 may have any suitable width and depth. For example, each depression 24 may be less than half the thickness of the die attach region 21 of the leadframe structure 22. Each depression 24 may have a length about equal to the width the lead 22(a)-2, 22(b)-2 that corresponds to it.

The depressions 24 in the leadframe structure 22 may be formed using any suitable process. For example, in some embodiments, stamping or a half-etching process can be used. A leadframe structure without depressions could be patterned with photoresist, and then partially etched in those areas where the depressions are to be formed. Photolithography and etching processes are well known to those of ordinary skill in the art.

Providing depressions 24 in the die attach region 21 of the leadframe structure 22 has a number of advantages. For example the depressions 24 restrict the flow of solder as a result of capillary action during reflow, thereby restricting the flow of the solder deposit towards the lead bends. By restricting the flow of solder towards the lead bends, the likelihood of die edge shorting is reduced.

As shown in FIG. 3(d), if the die attach region does not have depressions, the semiconductor die 30 moves, because of the capillary flow of the solder deposit 36(a) towards the bent lead 22(b)-2 during the re-melting of the solder deposit 36(a). The semiconductor die 30 also moves in the direction of the arrow 92 along with the moving solder deposit 36(a), and the edge of the semiconductor die 30 can contact the lead 22(b)-2 at the point 90, thus short circuiting the semiconductor die 30. In contrast, as shown in FIG. 3(e), when depressions 24 are formed in the die attach region of the leadframe structure 22, the solder deposit 36(a) flows into the depressions 24, thus inhibiting the side-to-side movement of the semiconductor die 30 during the re-melting of the solder deposit 36(a). The semiconductor die 30 remains between opposite leads of the leadframe structure 22. Thus, the depressions 24 help to prevent die edge shorting between the edge of the semiconductor die 30 and the bent leads of the leadframe structure 22.

Figure 4A:
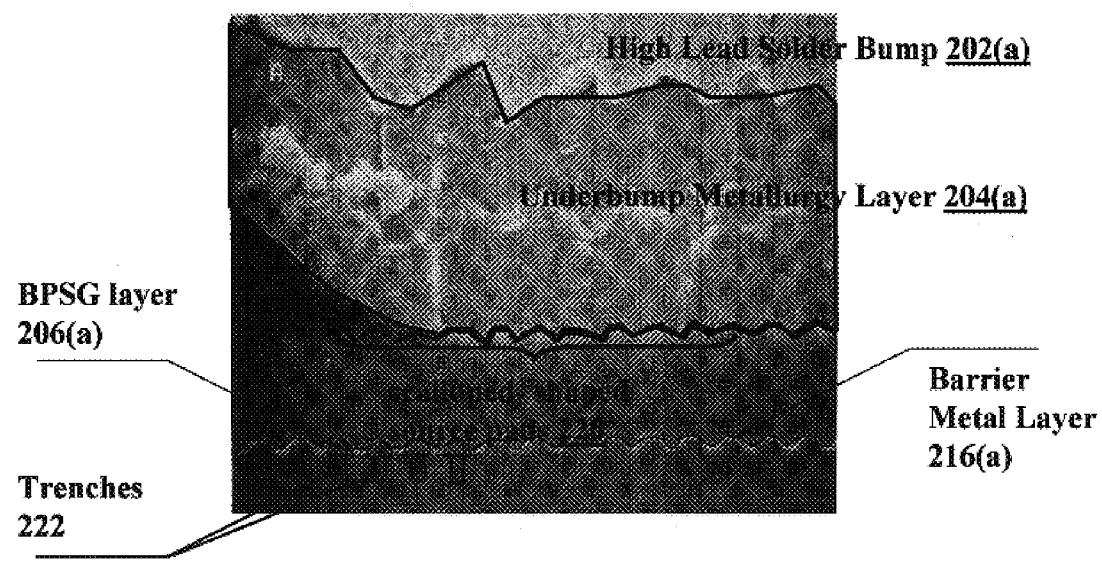
FIG. 4(a) shows an SEM (scanning electron microscope) photograph of a cross-section of a scalloped-shaped source pad.

To enhance the bond between the semiconductor die and the leadframe structure, the bond pads in the semiconductor die may be formed with uneven surfaces so that the solder that is on the bond pads tightly adheres to the bond pads. FIG. 4(a), for example, shows an SEM (scanning electron microscope) photo of a cross-section of a scalloped-shaped source pad 220 in a semiconductor die. The semiconductor die includes a number of trenches 222 and BPSG (borophosphosilicate glass) domes 206(a) over the trenches 222. The trenches 222 may be trenched gates and the domes 206(a) isolate the trenched gates from the source pad 220. A barrier layer metal 216(a) in the form of a thin white layer can be viewed through the SEM. The source pad 220, which is formed on top of the barrier metal layer 216(a) has an upper surface that is uneven and scallop-shaped. As shown in FIG. 4(a), an underbump metallurgy layer 204(a) is deposited on the source pad 220, and a high lead solder bump 202(a) is on the underbump metallurgy layer 204(a).

When a blanket layer of BPSG gets deposited on top of the gate trenches, parts of it are etched out forming dome shaped structures on top of the gate trenches. This is done in order to isolate electrically the gate trenches from the rest of the source area. These "dome" structures, with flat areas in between, serve as the base wherein a barrier metal layer and an aluminum layer are deposited. During the deposition of the barrier metal layer and the aluminum layer, the deposited metal layers follow the contour or topography of the dome structures, thus forming a scalloped shaped source pad. The shape of the source pad helps to adhere the source pad to the underbump metallurgy layer.

Figure 4B:
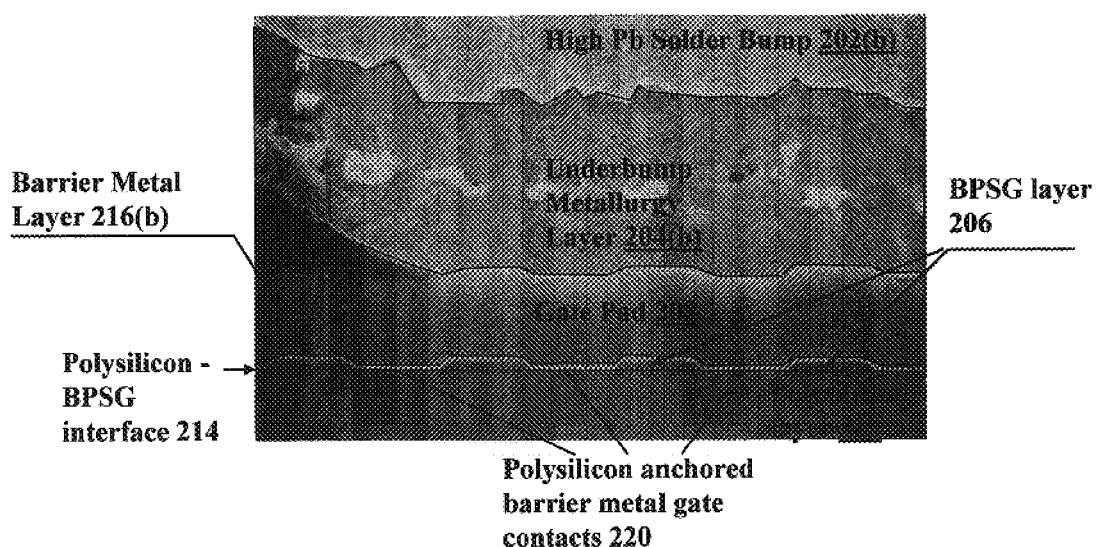
FIG. 4(b) shows an SEM photograph of a cross-section of a gate pad with an uneven top surface.

FIG. 4(b) shows a cross-section of an aluminum gate bond pad 208. In this embodiment, a polysilicon layer 210 has a number of BPSG humps 206. A thin barrier metal layer portion (e.g., titanium) 216(b) is over the BPSG humps 206. A portion of the barrier metal reacts with the polysilicon layer to form a thin interlayer of silicide (titanium silicide) at 220. This silicide layer holds the barrier metal layer 216(b) and the polysilicon layer 210 together thereby increasing the adhesion strength of the barrier metal layer 216(b). (This is better than just contacting all of the barrier metal layer with BPSG, since, for example, a Ti-BPSG connection is governed mainly by Van der Walls bonding.) A gate pad metal layer 208 such as an aluminum layer is also deposited over the barrier metal layer 216(b). In embodiments of the invention, gate contact areas to the BPSG are retained, so as to have stress-relievers whenever the structure experiences shear stresses during processing and during end user applications.

As shown in FIG. 4(b), when the gate pad metal (which may be an aluminum pad) 208 is formed on the BPSG humps 206, the resulting upper surface of the gate pad metal 208 is uneven. The underbump metallurgy layer 204(b) adheres tightly to the upper surface of the gate pad metal 208, and a high lead solder bump 202(b) is on the underbump metallurgy layer 204(b). The uneven gate pad metal 208 surface provides improved bump attachment integrity by providing good pad topography and an increased attach area.

In the embodiment shown in FIG. 4(b), in order to form the BPSG humps 206, 5×5 square micron holes are formed in a continuous BPSG layer. The holes may be formed using an etching process. The topography can change depending on how the BPSG layer is etched.

Figure 5A:
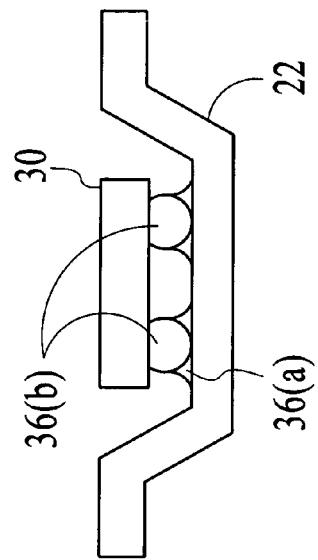
FIG. 5(a) shows side view of a semiconductor package with high-lead solder bumps before solder reflow.

FIG. 5(a) illustrates the particular solder structures that are used in embodiments of the invention. FIG. 5(a) shows a semiconductor die 30 attached to a leadframe structure 22, after the semiconductor die 30 that is bumped with the solder bumps 36(b) is flipped over and mounted to discrete deposits of solder deposit 36(a) on the die attach region of the leadframe structure 22, but before reflowing the solder deposit 36(a). Prior to attaching the bumped semiconductor die 30 to the leadframe structure 22, the solder bumps 36(b) can be formed on the bond pads of the semiconductor die 30. The solder bumps 36(b) can be formed by, for example, a pick and place process, a dispensing process, a ball attach process, etc.

The solder bumps 36(b) may comprise high lead solder (e.g., 95Pb/5Sn), while the solder deposit 36(a) may comprise an ordinary solder such as 63Pb/37Sn. As shown in FIG. 5(a), the vertical offset D of the second surface 30(b) of the semiconductor die 30 to the ends of the leads may be limited to a maximum of 70 microns. Each combination of solder deposit 36(a) (e.g., before or after reflow) and a corresponding solder bump 36(b) may be referred to as a solder structure.

The discrete solder deposit 36(a) may be deposited on the die attach region of the leadframe structure 22 using a multi-nozzle dispense tool to create consistent solder dot arrays. The solder deposit 36(a) can be chosen such that its melting point is above the board mounting requirement, and is below the melting points of the solder in the solder bumps 36(b).

Figure 5C:
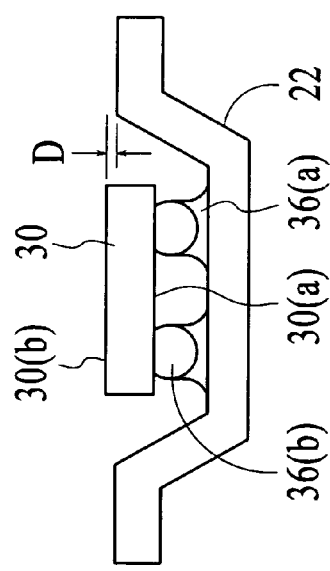
FIG. 5(c) shows a side view of a package without high-lead solder bumps.
Figure 5B:
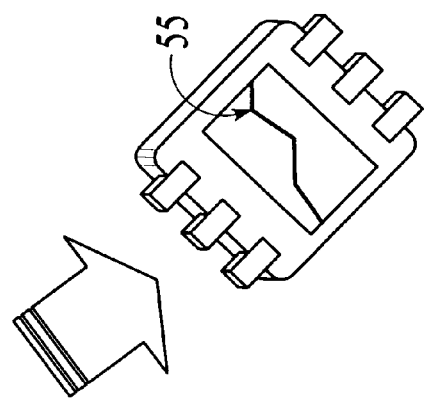
FIG. 5(b) shows side view of a semiconductor package with high-lead solder bumps after solder reflow.
Figure 5D:
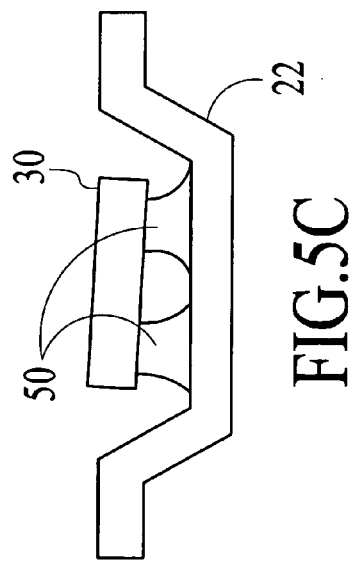
FIG. 5(d) shows a bottom perspective view of a package with a cracked semiconductor die.

After reflow, as shown in FIG. 5(b), the second surface 30(b) of the semiconductor die 30 and the ends of the leads of the leadframe structure 22 may be substantially co-planar as the solder deposit 36(a) melts and then re-solidifies. Because of the high lead content in the high lead solder bumps 36(b), the high lead solder bumps 36(b) do not collapse. In this "no collapse" process, the standoff of the die is maintained, since the solder bumps 36(b) do not re-melt during solder paste reflow. This process makes it possible to control the die to lead co-planarity of less than 70 microns and also makes it possible to avoid die tilting which can cause cracks in the die.

As shown in FIG. 5(c), if high lead solder bumps are not used, and the solder structures have only solder that melts at low temperatures, then the solder structures may collapse upon reflow. In this "full collapse" process, soldering flux is used instead of a solder paste to remove oxides from the solder bump surfaces prior to re-melting. As shown in FIG. 5(c), a tilted die results from the full collapse process. The tilted die eventually results in die cracks after molding (see e.g., the crack 55 in FIG. 5). Since the semiconductor die does not tilt when using high lead solder or other non-deformable conductive structure, the resulting semiconductor die does not crack in the final semiconductor package. In addition, if the second surface 30(b) of the semiconductor die 30 is not co-planar with the ends of the leads of the leadframe structure 22, then the second surface 30(b) and the ends of the leads may not make good contact to the conductive lands on a circuit substrate.

After the semiconductor die is attached to the leadframe structure, a molding material is molded around the semiconductor die and the die attach region of the leadframe structure. In preferred embodiments, a film assisted molding process is used. In a film assisted molding process, a film is used between molding dies of a mold tool. The film serves as a cushion for the semiconductor die during molding, thus absorbing the stress and preventing die cracks. The use of a film also allows a smaller clamping force to be used. The film may be an adhesive-free film, which protects the exposed die back side and the leads from mold bleed that can prevent solderability during board mounting. An exemplary film is a fluoropolymer film that has a matted surface finish on one side and a glossy finish on the other side. It is sold under the tradename AFLEX 50KN. Other commercially available mold release films could be used in other embodiments.

Referring to FIG. 6(a), a film 82 is mounted in between the open top and bottom mold dies 80(a), 80(b) in a molding apparatus. Then, a leadframe carrier 84 in the form of a strip is loaded on the bottom mold die 80(a) and is positioned such that the exposed second surface of the semiconductor die 30 is beneath the film 82 and the semiconductor die is in a mold cavity 80(a)-1 in the bottom mold die 80(a). The film 82 is then suctioned to the top mold die 80(b) to hold it flat against the inner surface thereof (air removal is shown by the arrow 58). Pellets (not shown) of the molding material are then loaded on the molding apparatus. The bottom mold die 80(a) then moves toward the top mold die 80(b) and clamps the leadframe carrier 84 and the film 82 together as shown in FIG. 6(b). The film 82 is pressed down on the die back instead of directly contacting the top mold die 80(b) (which may be made of metal), thus absorbing a certain amount of stress, which could translate into die cracking during clamping. The molding material is then melted and is transferred from the loading station to the individual mold cavities. During this state, the film 82 acts as a barrier to prevent the molding material from depositing on the exposed die back side and the bottom surfaces of the leads, thus ensuring that the back sides of the semiconductor dies and the leads are free of molding material (as shown in FIG. 6(c)). As shown in FIG. 6(c), each semiconductor die 30 has a molded molding material 40 around it. The bottom mold die 80(a) moves down to open the two mold dies 80(a), 80(b) and ejects the molded strip upon reaching the home position as shown in FIG. 6(a). No mold flashes were noted during actual testing of the top surfaces of the dies.

After molding, the molded semiconductor packages that are in an array of semiconductor packages in the leadframe carrier are singulated. The singulation process is preferably a tapeless singulation process. A tapeless singulation process uses a metal saw jig instead of commonly used dicing tapes to hold the semiconductor packages in place during sawing. A strip of molded packages can be loaded onto a jig with recesses that are arranged in a layout similar to the layout of the molded packages in the leadframe carrier, while the back sides of the semiconductor die face upward. The leadframe carrier orientation is chosen to minimize vertical burr formation in the direction of the flat side of the package (which can cause mounting problems). The recesses and vacuum hold the molded packages in place during sawing.

The tapeless singulation process has advantages over conventional singulation processes that use adhesive tapes. In the conventional singulation process, dicing tapes are discarded after every use. In contrast, in embodiments of the invention, the jig is reusable. Accordingly, embodiments of the invention are cost effective.

Figure 7:
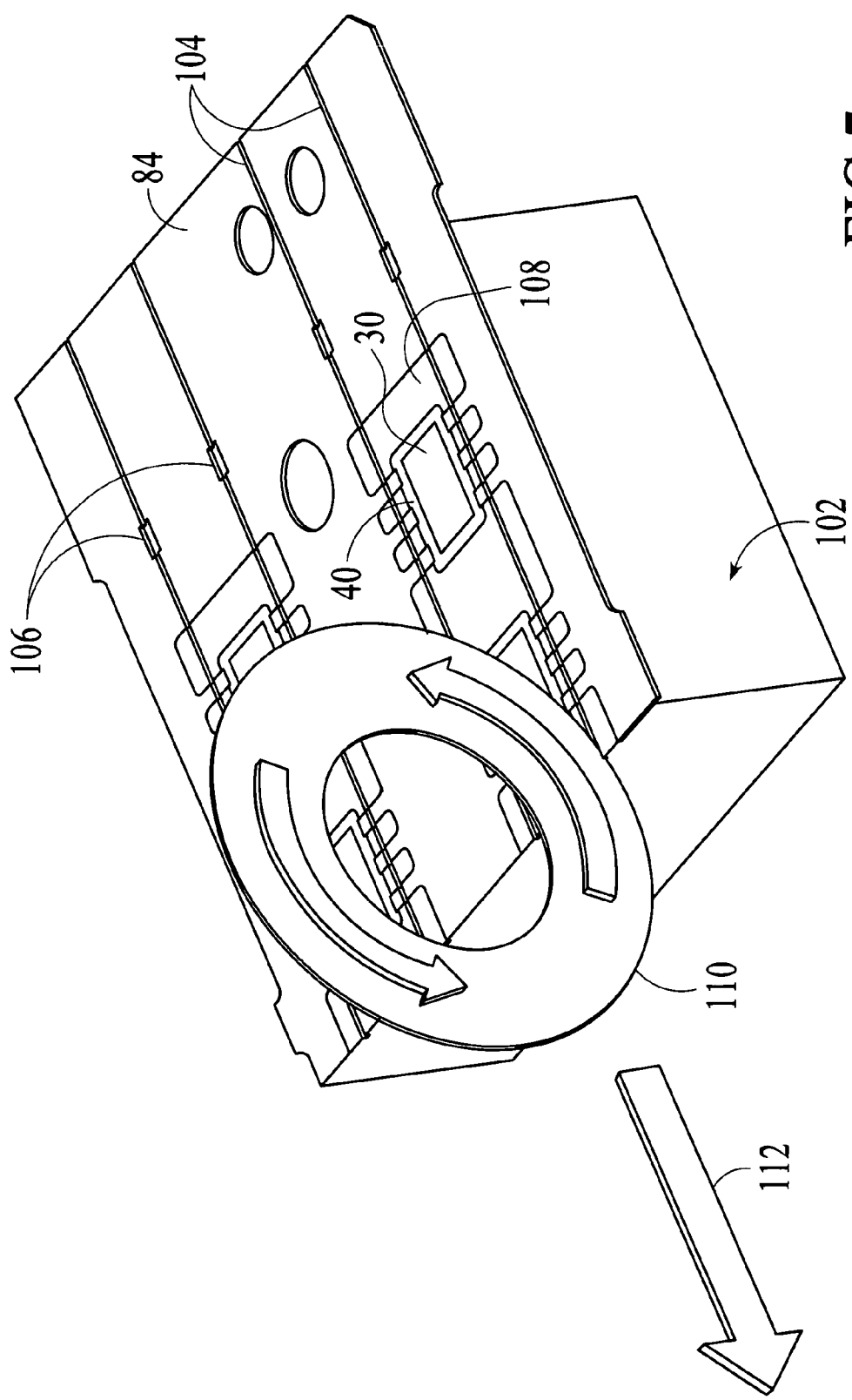
FIG. 7 shows a perspective view of a saw, a jig, and a leadframe carrier during a singulation process.
Figure 8:
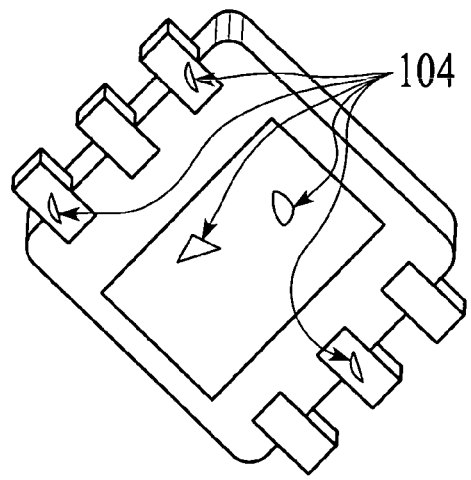
FIG. 8 shows a semiconductor package with adhesive residue on an underside of the semiconductor package.

Referring to FIG. 7, during processing, a leadframe carrier 84 including a number of semiconductor package units is mounted onto a metal saw jig 102. Each package unit includes a semiconductor die 30, and a molding material 40 as previously discussed. Every semiconductor package unit in the leadframe carrier 84 is held to the jig 102 by vacuum suction. Holes 108 in the leadframe carrier 84 expose the top surface of the jig 102. The vacuum suction provided by the jig 102 ensures that there is no movement of the leadframe carrier 84, which could cause jagged edges or burrs on the package leads after sawing.

The individual semiconductor package units are then singulated by cutting the leadframe carrier 84 with a saw 110 as shown in FIG. 7. Saw slots 104 are formed in the leadframe carrier 84. Fiducials 106 guide the saw 110 as the saw 110 passes through the leadframe carrier 84 in the direction shown by the arrow 112. A metal bonded or a nickel bonded blade is used when a copper leadframe carrier is being sawn.

Fiducials 106 may be formed in the leadframe carrier 84 by etching, stamping, etc. After singulation, the saw jig 102 with the singulated package units can pass to a pick and place station for sorting and then final packaging. For example, the packages may be optionally washed and dried.

Figure 9A:
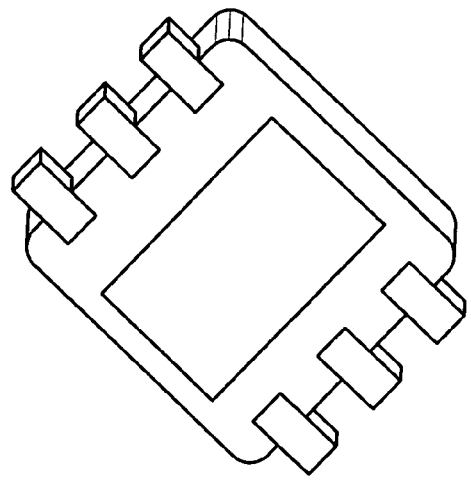
FIG. 9(a) shows a perspective view of a semiconductor package after sawing without using the inventive leadframe carrier.
Figure 9B:
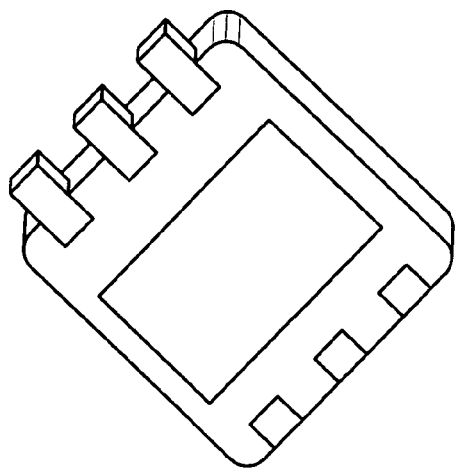
FIG. 9(b) shows a perspective view of a semiconductor package after sawing using the inventive leadframe carrier.

Providing fiducials in a leadframe carrier has a number of advantages. First, the fiducials provide for accurate and consistent cutting, thereby decreasing the likelihood of forming defective packages. For example, FIG. 9(a) shows a semiconductor package where misaligned cutting occurred when fiducials were not used, while FIG. 9(b) shows a semiconductor package where sawing was performed using a carrier with fiducials. FIG. 9(a) shows leads on one side of the semiconductor package that are shorter than the leads on the other side. FIG. 9(b) shows leads on opposite sides of the semiconductor package being substantially equal in length. Second, in the sawing process that is described with reference to FIG. 7, tapes need not be used. This eliminates the amount of adhesive residue on the formed semiconductor packages.

As noted above, tape could be used to hold the leadframe carrier 84 instead of a vacuum jig 102. However, if tape is used, tape adhesive substances can remain on the surface of a semiconductor die or leads after removing the tape, thus contaminating the die surfaces and the leads, which need to be soldered to a circuit board. For example, tape residue 114 on the back side of the semiconductor package shown in FIG. 8 can inhibit bonding.

In addition, sawing the leadframe carrier to singulate the semiconductor packages has advantages over, for example, punching them. Blade sawing induces the least amount of stress to the lead and package, so that the likelihood of potential delamination is greatly reduced. Of course, in other embodiments, a mechanical singulation process such as traditional punch and die systems are used to punch out semiconductor packages from a leadframe strip to singulate them.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed. Moreover, any one or more features of any embodiment of the invention may be combined with any one or more other features of any other embodiment of the invention, without departing from the scope of the invention.

All patents, patent applications, and publications mentioned above are herein incorporated by reference for all purposes.

What is claimed is:

1. A semiconductor package comprising:
   (a) a semiconductor die including a first side and a second side, wherein the semiconductor die further includes a bond pad at the first side, the bond pad comprising an uneven surface;
   (b) a leadframe structure comprising (i) a substantially planar die attach region, and (ii) a plurality of leads extending away from the die attach region;
   (c) a plurality of solder structures between the semiconductor die and the leadframe structure and coupling the die attach region to the semiconductor die;
   (d) a depression formed in the leadframe structure, the depression being between the one of the solder structures in the plurality of solder structures, and one of the leads in the plurality of leads, and wherein the depression is formed at an edge region of the die attach region; and
   (e) a molding material covering the die attach region of the leadframe structure, the plurality of solder structures, and the first side of the semiconductor die,
   wherein the leads in the plurality of leads extend laterally away from and outside of the molding material, and
   wherein the solder structures are on the die attach pad and wherein the die attach pad includes a portion that is between and bridges the solder structures.

2. The semiconductor package of claim 1, wherein the second side of the semiconductor die is exposed through the molding material and a surface of the molding material is substantially coplanar with the second side of the semiconductor die.

3. The semiconductor package of claim 1, wherein the leadframe comprises a gate lead structure and a source lead structure.

4. The semiconductor package of claim 1, wherein the leadframe comprises a gate lead structure and a source lead structure, and the gate lead structure and the source lead structure are electrically isolated from each other.

5. The semiconductor package of claim 1, wherein the second side of the semiconductor die includes a drain region.

6. The semiconductor package of claim 1, wherein the leadframe structure comprises a layer of metal plating and a gold sublayer in the metal plating.

7. A semiconductor package comprising:
   (a) a semiconductor die including a first side and a second side, wherein the semiconductor die further includes a bond pad at the first side, the bond pad comprising an uneven surface;
   (b) a leadframe structure comprising (i) a substantially planar die attach region, (ii) a surface opposite the substantially planar die attach region, and (iii) a plurality of leads extending away from the die attach region;
   (c) a plurality of solder structures between the semiconductor die and the leadframe structure and coupling the die attach region to the semiconductor die;

(d) a depression formed in the leadframe structure, the depression being between the one of the solder structures in the plurality of solder structures, and one of the leads in the plurality of leads, and wherein the depression is formed at an edge region of the die attach region; and (e) a molding material covering the die attach region of the leadframe structure, the plurality of solder structures, and the first side of the semiconductor die, and also covering the surface of the leadframe structure opposite the substantially planar die attach region;

wherein the semiconductor package further comprises a plurality of depressions, the depressions in the plurality of depressions being respectively located proximate to inner portions of the leads, and wherein the solder structures are on the die attach pad and wherein the die attach pad includes a portion that is between and bridges the solder structures.

8. The semiconductor package of claim 7, wherein the second side of the semiconductor die is exposed through the molding material.

9. The semiconductor package of claim 7, wherein the leadframe structure comprises a gate lead structure and a source lead structure.

10. The semiconductor package of claim 7, wherein the leadframe structure comprises a gate lead structure and a source lead structure, and the gate lead structure and the source lead structure are electrically isolated from each other.

11. The semiconductor package of claim 7, wherein the second side of the semiconductor die includes a drain region.

12. The semiconductor package of claim 7, wherein the leadframe structure comprises a layer of metal plating and a gold sublayer in the metal plating.

* * * * *